(12) United States Patent
Hoegerl et al.

(10) Patent No.: US 11,385,301 B2
(45) Date of Patent: Jul. 12, 2022

(54) SENSOR DEVICES HAVING A SENSOR CHIP AND BUSBAR

(71) Applicant: Infineon Technologies AG, Neubiberg (DE)

(72) Inventors: Juergen Hoegerl, Regensburg (DE); Rainer Markus Schaller, Saal a.d. Donau (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/948,343

(22) Filed: Sep. 14, 2020

(65) Prior Publication Data

US 2021/0088600 A1    Mar. 25, 2021

(30) Foreign Application Priority Data

Sep. 23, 2019 (DE) .......................... 102019125537.6

(51) Int. Cl.
| | |
|---|---|
| *G01R 19/00* | (2006.01) |
| *G01R 33/00* | (2006.01) |
| *G01R 33/07* | (2006.01) |
| *G01R 33/09* | (2006.01) |

(52) U.S. Cl.
CPC ......... *G01R 33/0005* (2013.01); *G01R 33/07* (2013.01); *G01R 33/09* (2013.01)

(58) Field of Classification Search
CPC ..... G01R 33/0005; G01R 33/09; G01R 33/07
See application file for complete search history.

(56) References Cited

U.S. PATENT DOCUMENTS

| | | |
|---|---|---|
| 5,041,780 A | 8/1991 | Rippel |
| 2013/0181703 A1* | 7/2013 | Ausserlechner ....... G01R 33/02 324/244 |
| 2019/0285667 A1 | 9/2019 | Milano et al. |

FOREIGN PATENT DOCUMENTS

DE    102014113313 B4    9/2017

* cited by examiner

*Primary Examiner* — Alesa Allgood
(74) *Attorney, Agent, or Firm* — Harrity & Harrity, LLP (57) ABSTRACT

A sensor device comprises a busbar, a dielectric arranged on the busbar, and a sensor chip arranged on the dielectric, wherein the sensor chip is designed to measure a magnetic field induced by an electric current flowing through the busbar, wherein the surface of the dielectric facing toward the busbar is spaced from the busbar in an area along the entire periphery of the dielectric.

20 Claims, 7 Drawing Sheets

SENSOR DEVICES HAVING A SENSOR CHIP AND BUSBAR

CROSS REFERENCE TO RELATED APPLICATION

This application claims priority to German Patent Application No. 102019125537.6 filed on Sep. 23, 2019, the content of which is incorporated by reference herein in its entirety.

TECHNICAL FIELD

The present disclosure relates in general to sensor devices. For example, the disclosure relates to sensor devices having a sensor chip and busbar.

BACKGROUND

Sensor devices can contain a sensor chip and a busbar. The busbar can be designed to conduct an electric current which is to be measured, whereas the sensor chip can be designed to measure a magnetic field induced by the electric current flowing through the busbar. The measurement between the sensor chip and the busbar can be performed in a contactless manner.

BRIEF DESCRIPTION

Different aspects relate to a sensor device. The sensor device comprises a busbar. The sensor device further comprises a dielectric arranged on the busbar. The sensor device further comprises a sensor chip arranged on the dielectric, wherein the sensor chip is designed to measure a magnetic field induced by the electric current flowing through the busbar. The surface of the dielectric facing toward the busbar is spaced from the busbar in an area along the entire periphery of the dielectric.

Different aspects relate to a sensor device. The sensor device comprises a lead frame, comprising a first part and a second part, wherein a thickness of the first part is greater than a thickness of the second part. The sensor device further comprises a busbar formed by the first part of the lead frame. The sensor device further comprises a connecting lead formed by the second part of the lead frame. The sensor device further comprises a sensor chip arranged on the connecting lead, wherein the sensor chip is designed to measure a magnetic field induced by an electric current flowing through the busbar. In an orthogonal projection of the sensor chip onto the busbar, the sensor chip overlaps at least partially with the busbar.

BRIEF DESCRIPTION OF THE DRAWINGS

Sensor devices according to the disclosure are explained in detail below with reference to drawings. The elements shown in the drawings are not necessarily presented true-to-scale in relation to one another. Identical reference numbers can denote identical components.

DETAILED DESCRIPTION

Figure 1:
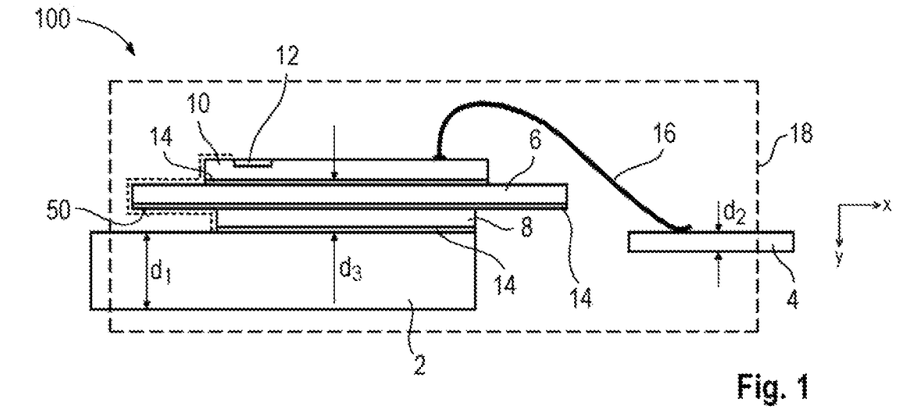
FIG. 1 shows schematically a cross-section side view of a sensor device 100 according to the disclosure.

FIG. 1 shows schematically a cross-section side view of a sensor device 100 according to the disclosure. The sensor device 100 is presented in a general manner in order to describe aspects of the disclosure in qualitative terms. The sensor device 100 can have further aspects which are not shown in FIG. 1 for the sake of simplicity. The sensor device 100 can be extended, for example, with any aspects which are described in conjunction with other sensor devices according to the disclosure. Descriptions relating to FIG. 1 can apply equally to other sensor devices described herein.

The sensor device 100 can have a lead frame with a first part 2 and a second part 4. First and second dielectrics 6 and 8 stacked on top of one another can be arranged above the first part 2 of the lead frame. A sensor chip 10 having one or more sensor elements 12 can be arranged above the first dielectric 6. The aforementioned components can be attached to one another using attachment materials 14. The sensor chip 10 can be electrically connected via an electrical connecting element 16 to the second part 4 of the lead frame. The components of the sensor device 100 can be at least partially encapsulated by an encapsulation material 18.

A lead frame can generally have one or more die pads and one or more connecting leads. At the start of and during the manufacture of a sensor device, the die pads and the connecting leads can be mechanically interconnected, for example via connecting bridges. The die pads and connecting leads can be manufactured, in particular, in one piece. During the manufacturing process, some of the die pads and connecting leads can be separated from one another, for example by severing the connecting bridges. A separation of the die pads and connecting leads can take place during or at the end of the manufacture of sensor packages (sensor housings), in particular following an encapsulation of the components of the sensor device to be manufactured with an encapsulation material. The separation can comprise one or more of the following: mechanical sawing, laser cutting, cutting, punching, milling, etching. According to the above descriptions, the first part 2 and the second part 4 of the lead frame can be mechanically interconnected during the manufacture of the sensor device 100 but can be mechanically separated from one another in the finished manufactured sensor device 100. In particular, a lead frame can be electrically conducting. The lead frame can be manufactured completely, for example, from metals and/or metal alloys, in particular from copper, copper alloys, nickel, iron-nickel, aluminum, aluminum alloys, steel, stainless steel.

The first part 2 of the lead frame can form a busbar 2 which can be designed to conduct an electric current which is to be measured. The first part or the busbar 2 can be formed, in particular, in one piece. The second part 4 of the lead frame can form a connecting lead 4. In the example in FIG. 1, only one connecting lead 4 is shown. In further examples, the lead frame can have any number of further connecting leads 4. A thickness $d_1$ of the busbar 2 can be greater than a thickness $d_2$ of the connecting lead 4. In one example, the lead frame can be a dual gauge lead frame. In a further example, the lead frame can have two lead frames with different thicknesses.

The sensor chip 10 or the sensor element 12 can be designed to measure a magnetic field induced by an electric current flowing through the busbar 2. The strength of the electric current can be determined on the basis of the measured magnetic field or the measured magnetic flow density of the induced magnetic field. The induced magnetic field can be measured, in particular, in a galvanically isolated or contactless manner. In an orthogonal projection of the sensor chip 10 or the sensor element 12 along the y-direction onto the busbar 2, the sensor chip 10 or the sensor element 12 can overlap at least partially with the busbar 2. The physical signals captured by the sensor chip 10 can be converted into electrical signals for further processing and can be forwarded via the electrical connecting element 16 and the connecting lead 4 to further components (not shown) for further processing or evaluation. In the example shown in FIG. 1, the electrical connecting element 16 can be a wire. In further examples, the electrical connecting element 16 can be formed by a ribbon or a clip.

In the example shown in FIG. 1, only one sensor element 12 of the sensor chip 10 is shown. In further examples, the sensor chip 10 can have one or more further sensor elements. The sensor chip 10, can, for example, be a differential magnetic field sensor chip having two sensor elements. The sensor element 12 can, for example, be a Hall sensor element, a magnetoresistive sensor element, a vertical Hall sensor element or a fluxgate sensor element. A magnetoresistive xMR sensor element can be designed in the form of an AMR sensor element, a GMR sensor element or a TMR sensor element. In the example shown in FIG. 1, the sensor element 12 can be arranged on a side of the sensor chip 10 facing away from the busbar 2. In a further example, the sensor element 12 can be arranged on a side of the sensor chip 10 facing toward the busbar 2.

Figure 2:
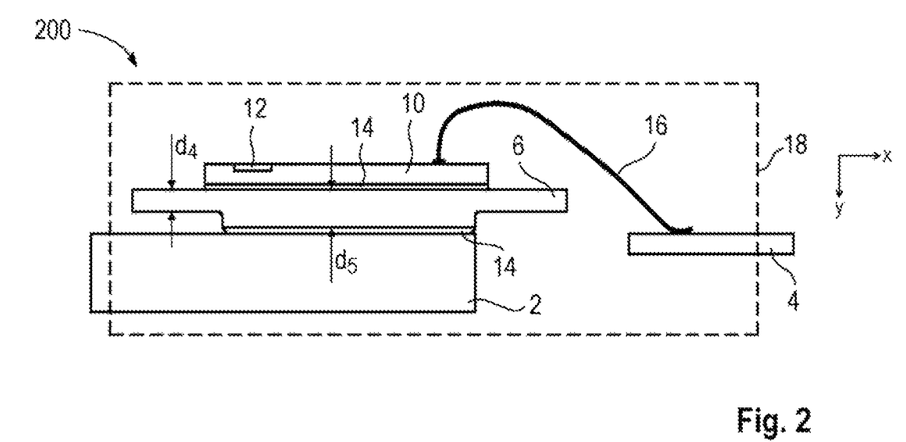
FIG. 2 shows schematically a cross-section side view of a sensor device 200 according to the disclosure.
Figure 3:
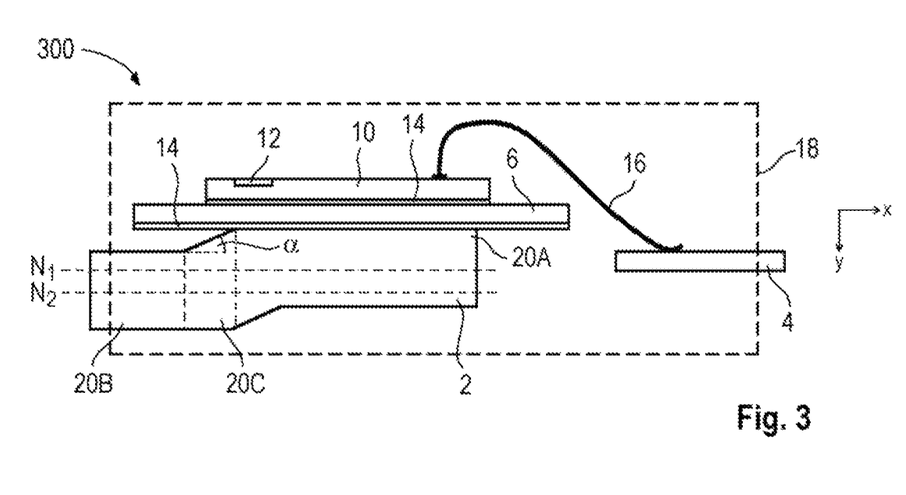
FIG. 3 shows schematically a cross-section side view of a sensor device 300 according to the disclosure.

In the example shown in FIG. 3, the dielectrics 6, 8 can be mechanically interconnected and can form a common dielectric. The surface 50 of the (common) dielectric 6, 8 facing toward the busbar 2 can be spaced from the busbar 2 in an area along the entire periphery of the dielectric 6, 8. In other words, the first dielectric 6 can project beyond or can overhang the second dielectric 8 in FIG. 1 in an area along its entire periphery viewed in the (negative) y-direction. A platform can hereby be provided on which the sensor chip 10 can be arranged. The dielectric 6 can be more extended than the sensor chip 10 and the dielectric 8 in a plane perpendicular to the y-direction. In the example shown in FIG. 2, the spacing between the first dielectric 6 and the busbar 2 can be provided by the second dielectric 8 which is arranged between the busbar 2 and the first dielectric 6. A resulting distance $d_3$ between the sensor chip 10 and the busbar 2 can be located in an upwardly and downwardly limited area. A lower limit of this area can be around 5 micrometers or around 10 micrometers or around 15 micrometers or around 20 micrometers or around 30 micrometers or around 40 micrometers. An upper limit of the area can be around 2 millimeters or around 1.5 millimeters or around 1 millimeter or around 500 micrometers or around 200 micrometers or around 100 micrometers.

The dielectrics 6, 8 can have essentially the same or different thicknesses in the y-direction. The thicknesses of the dielectrics 6, 8 can be essentially constant along the x-direction. Viewed in the (negative) y-direction, the outline or contour of the second dielectric 8 can be located (in particular completely) within the outline of the first dielectric 6. Similarly, viewed in the (negative) y-direction, the outline or contour of the sensor chip 10 can be located (in particular completely) within the outline of the first dielectric 6. The outlines of the dielectrics 6, 8 can in each case have any shape, for example round, oval, elliptical, square, rectangular, polygonal. The dielectrics 6, 8 can in each case comprise one of the following materials: ceramic, glass, silicone-based materials, polymer-based materials. The dielectrics 6, 8 can be manufactured from the same or from different materials. In one specific example, one or both of the dielectrics 6, 8 can be designed in the shape of a small plate made from a dielectric material.

A creepage path between the busbar 2 and electrically conducting areas of the sensor chip 12 can extend along a surface of the dielectric 6, 8. A creepage path can be defined as the shortest distance along the surface of a solid electrically conducting material between two electrically conducting parts. A creepage path of the sensor device 100 can obviously depend on the shape and dimensions of the dielectric 6, 8. A creepage path can extend, for example, along a path as shown in FIG. 1 by way of example as broken lines. Creepage distances of the sensor device 100 can be increased due to the shape of the dielectric 6, 8 according to the present disclosure and, in particular, due to the resulting spacing between the busbar 2 and the dielectric 6, 8 around the entire periphery of the dielectric 6, 8. The resilience of the sensor device 100, for example to possibly occurring leakage currents, can be improved as a result. An increased galvanic isolation between the busbar 2 and the sensor chip 10 can further be provided. The risk of a possible operational outage of the sensor device 100 can thereby be avoided or at least reduced. Viewed in the (positive) y-direction, the outline of the sensor chip 10 can be located (in particular completely) within the outline of the first dielectric 6. A leakage distance between the busbar 2 and the sensor chip 10 can similarly be increased using a relative arrangement of this type. In a further example, the dielectric 8 can also be replaced by an electrically conducting element. A galvanic isolation between the busbar 2 and the sensor chip 10 does not have to be lost as a result and can still be provided by the dielectric 6. The electric conductivity of the element 8 can be chosen, in particular, according to the effect that this conductivity has on the quality of a magnetic measurement.

The attachment materials 14 can in each case have, for example, one or more of the following: carbon-filled DAF (Die Attach Film), carbon-filled adhesive, weakly conducting glass solder, non-conducting DAF, non-conducting adhesive, conducting adhesive (in particular not silver-filled). The individual parts of the attachment material 14 arranged between the respective components of the sensor device 100 can consist of the same material or from different materials.

Figure 14:
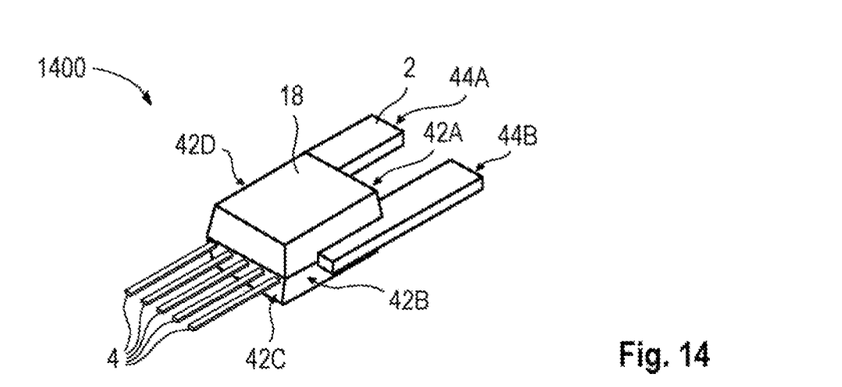
FIG. 14 shows schematically a perspective view of a sensor device 1400 according to the disclosure.
Figure 15:
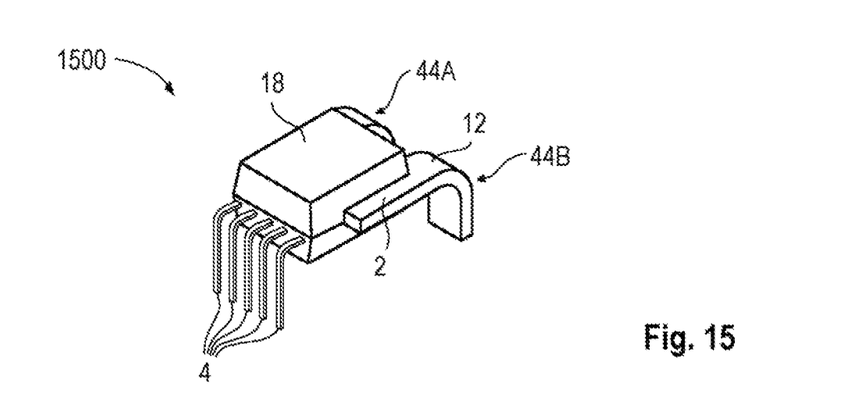
FIG. 15 shows schematically a perspective view of a sensor device 1500 according to the disclosure.
Figure 16:
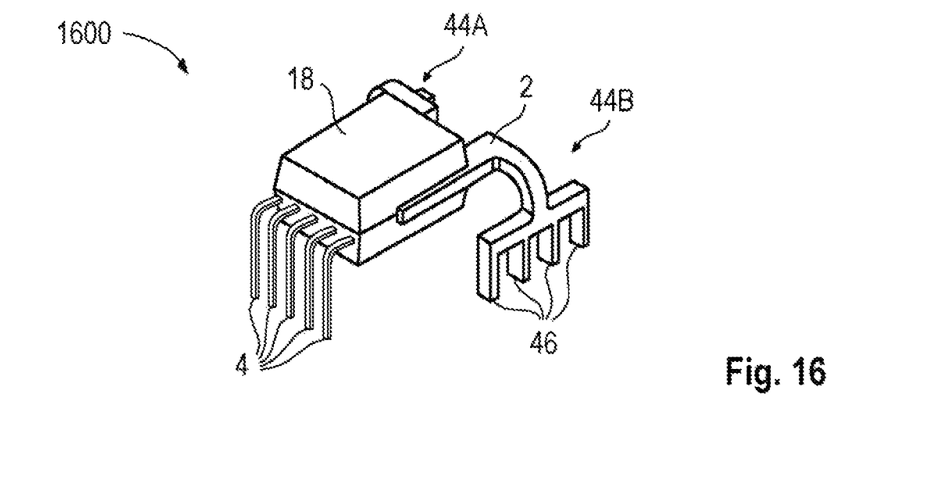
FIG. 16 shows schematically a perspective view of a sensor device 1600 according to the disclosure.

The encapsulation material 18 of the sensor device 100 is shown qualitatively in FIG. 1 by a broken line. Example perspective views of housed sensor devices according to the disclosure are shown in FIGS. 14 to 16. The encapsulation material 18 can encapsulate one or more components of the sensor device 100. The busbar 2 and the connecting lead 4 can protrude at least partially from the encapsulation material 18 in order to be able to be contacted from outside the encapsulation material 18. The encapsulation material 18 can comprise at least one of the following: a mold connection, a laminate, an epoxy, a filled epoxy, a glass-fiber-filled epoxy, an imide, a thermoplastic, a thermosetting polymer, a polymer blend.

The sensor device 100 can, in particular, be a coreless sensor device, e.g. the sensor device 100 can have or use no magnetic field concentrator to concentrate the magnetic field induced by the electric measuring current.

FIGS. 2 to 7 show schematically cross-section side views of sensor devices 200 to 700 according to the disclosure. The sensor devices 200 to 700 can be at least partially similar to the sensor device 100 shown in FIG. 1, so that explanations relating to FIG. 1 can apply to each of FIGS. 2 to 7 also.

In the example shown in FIG. 2, the spacing between the dielectric 6 and the busbar 2 already discussed in connection with FIG. 1 can be provided using a shape or shaping of the dielectric 6. The dielectric 6 can have different thicknesses $d_4$ and $d_5$ due to the shaping. The transition between the parts having a differing thickness can, for example, have the shape of a step. The dielectric 6 can be formed in one piece. In one example, the dielectric can be a molded or structured small glass plate. In further examples, the dielectric 6 can be manufactured from one of the materials already mentioned in connection with FIG. 1.

In the example shown in FIG. 3, a spacing between the dielectric 6 and the busbar 2 can be provided by a curving or shaping or shape of the busbar 2. The busbar 2 can have two parts or sections 20A, 20B which can be located on different levels $N_1$ and $N_2$ in relation to the y-direction. The dielectric 6 can be arranged in relation to the two sections 20A, 20B of the busbar 2 in such a way that the spacing between the dielectric 6 and the busbar 2 is provided. In the example shown in FIG. 3, a section 20C of the busbar 2 which connects the two sections 20A, 20B located on different levels can form an angle α with the latter. The value of the angle α can obviously depend on the desired spacing between the busbar 2 and the dielectric 6. The angle α can, for example, have a value between around 10 degrees and around 90 degrees. The curving of the busbar 2 can be provided by any process, for example by one or more of bending, punching, stamping. The busbar 2 can be formed, in particular, in one piece.

Figure 4:
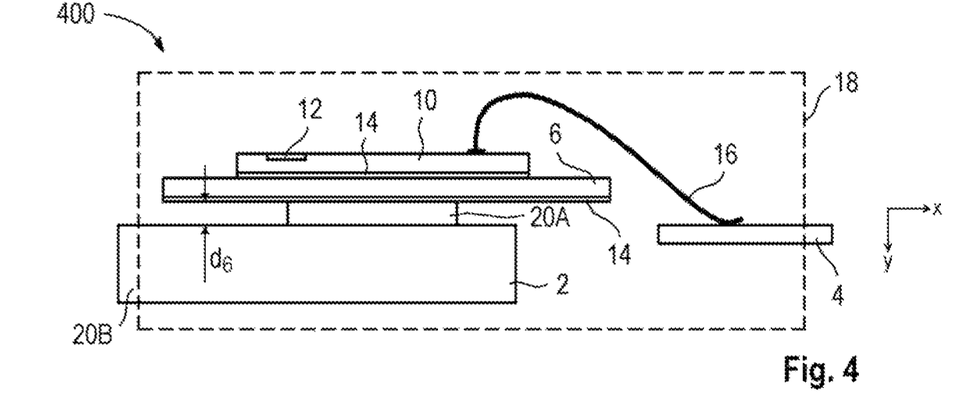
FIG. 4 shows schematically a cross-section side view of a sensor device 400 according to the disclosure.

In the example shown in FIG. 4, the busbar 2 can have a first section 20A and a second section 20B, wherein the first section 20A can be connected to the dielectric 6 and the second section 20B can be at a distance $d_6$ from the dielectric 6. The first section 20A of the busbar 2 can form a base 20A (or a platform or pillar). A spacing between the dielectric 6 and the busbar 2 can be provided by the base 20A arranged on the busbar 2, wherein the dielectric 6 can be mechanically connected to the base 20A. The base 20A can be formed by any suitable process, for example by one or more of bending, punching, stamping. The busbar 2 can be formed, in particular, in one piece. Viewed in the y-direction, the base 20A can have any shape, for example round, oval, elliptical, square, rectangular, polygonal.

Figure 5:
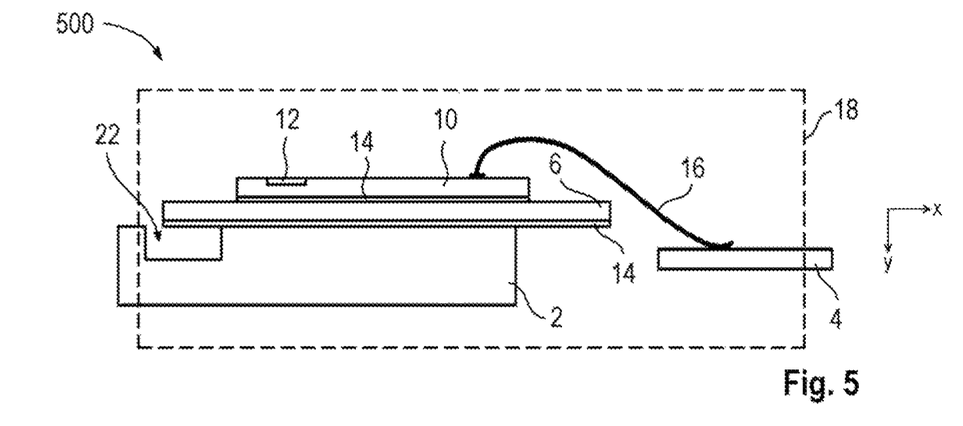
FIG. 5 shows schematically a cross-section side view of a sensor device 500 according to the disclosure.

In the example shown in FIG. 5, the spacing between the dielectric 6 and the busbar 2 can be provided by one or more depressions 22 (or holes or cavities or recesses) in the busbar 2. The dielectric 6 can be arranged in relation to the depression 22 in such a way that a spacing according to the disclosure is provided between the dielectric 6 and the busbar 2. In the side view shown in FIG. 5 and/or viewed in the y-direction, the depression 22 can have any shape, for example round, oval, elliptical, square, rectangular, polygonal. The depression 22 can be provided by any suitable process, for example by one or more of punching, stamping, etching. The busbar 2 can be formed, in particular, in one piece.

Figure 6:
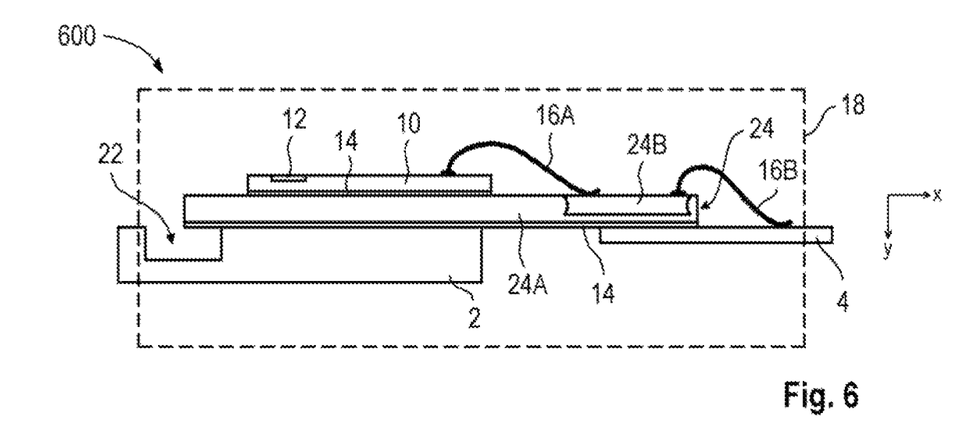
FIG. 6 shows schematically a cross-section side view of a sensor device 600 according to the disclosure.

Similar to FIG. 5, a spacing between a dielectric and the busbar 2 be provided in the example shown in FIG. 6 by one or more depressions 22 in the busbar 2. In further examples, the spacing can also be provided in a different manner described in connection with the preceding figures. In the example shown in FIG. 6, the dielectric can be designed in the form of a Routable Molded Lead Frame (Rt-MLF) 24. The Rt-MLF 24 can, for example, have one or more electrically isolating laminate layers in the x-direction and electrically conducting via connections passing through the laminate layers in the y-direction. FIG. 6 shows by way of example an electrically isolating section 24A and an electrically conducting section 24B of the Rt-MLF 24. The Rt-MLF 24 can have any number of further electrically isolating or electrically conducting sections which are not shown in FIG. 6 for the sake of simplicity. The electrically isolating section 24A of the Rt-MLF 24 can be free from electrically conducting structures (for example via connections) and can provide a galvanic isolation between the busbar 2 and the sensor chip 10. The sensor chip 10 can be electrically connected to the connecting lead 4 via a first electrical connecting element 16A, via the electrically conducting section 24B and via a second electrically connecting element 16B. A wiring between the sensor chip 10 and the connecting lead 4 can be provided in this way over longer distances in the x-direction.

Figure 7:
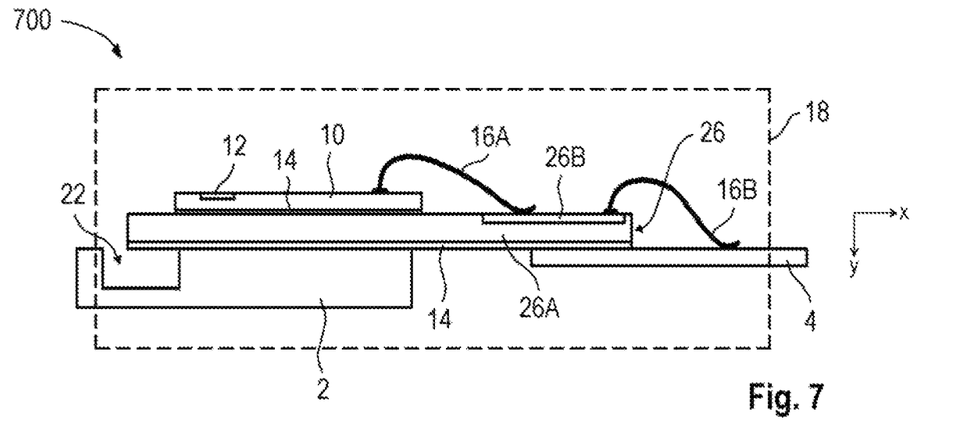
FIG. 7 shows schematically a cross-section side view of a sensor device 700 according to the disclosure.

The sensor device 700 shown in FIG. 7 can be at least partially similar to the sensor device 600 shown in FIG. 6. In contrast to FIG. 6, the dielectric shown in FIG. 7 can be formed by a substrate 26 (or a board). Similar to the Rt-MLF 24 shown in FIG. 6, the substrate 26 shown in FIG. 7 can have one or more electrically isolating or electrically conducting sections 26A and 26B. In particular, the substrate 26 can have a rewiring structure on its upper side and/or underside. A rewiring between the sensor chip 10 and the connecting lead 4 can be provided in a manner similar to FIG. 6.

Figure 8:
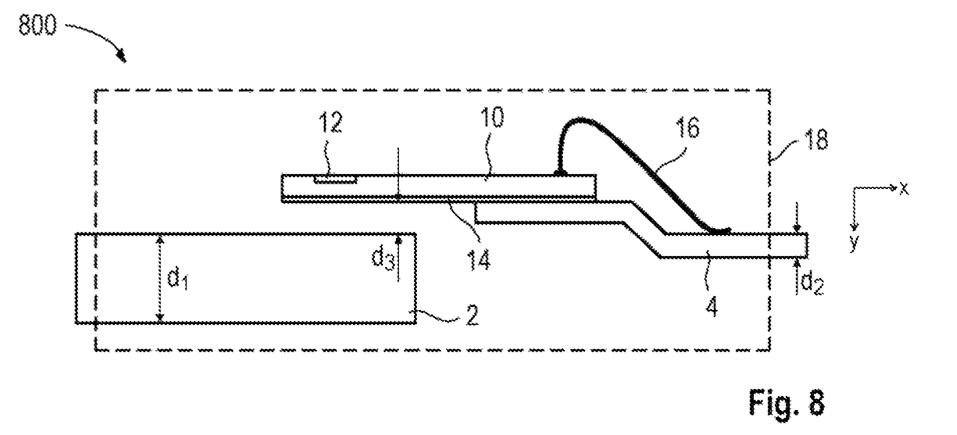
FIG. 8 shows schematically a cross-section side view of a sensor device 800 according to the disclosure.

FIG. 8 shows schematically a cross-section side view of a sensor device 800 according to the disclosure. The sensor device 800 is presented in a general manner in order to describe aspects of the disclosure in qualitative terms. The sensor device 800 can have further aspects which are not shown in FIG. 8 for the sake of simplicity. The sensor device 800 can be extended, for example, with any aspects which are described in conjunction with other sensor devices according to the disclosure. Descriptions relating to FIG. 8 can apply equally to other sensor devices described herein.

The sensor device 800 can have a lead frame with a first part 2 and a second part 4. A sensor chip 10 having one or more sensor elements 12 can be arranged above the second part 4. The sensor chip can be attached to the second part 4 of the lead frame using an attachment material 14. In the example shown in FIG. 8, the attachment material 14 can be arranged on the underside of the sensor chip 10, covering the entire area. In further examples, the attachment material does not have to cover the entire area but can be arranged, for example, only between the contact surfaces of the sensor chip 10 and of the second part 4 of the lead frame. The sensor chip 10 can be electrically connected via one or more electrical connecting element 16 to the second part 4 of the lead frame. One or more components of the sensor device 800 can be at least partially encapsulated by an encapsulation material 18. The components of the sensor device 800 can be similar to corresponding components of previously described sensor devices according to the disclosure. Explanations relating to components of the sensor device 100 shown in FIG. 1, for example, can thus apply to the components of the sensor device 800 shown in FIG. 8 also.

The first part 2 of the lead frame can form a busbar 2 which can be formed, in particular, in one piece. The second part 4 of the lead frame can form one or more connecting leads 4. A thickness $d_1$ of the busbar 2 can be greater than a thickness $d_2$ of the connecting lead 4. The lead frame can, for example, be a dual gauge lead frame.

The sensor chip 10 or the sensor element 12 can be designed to measure a magnetic field induced by an electric current flowing through the busbar 2. In an orthogonal projection of the sensor chip 10 or the sensor element 12 along the y-direction onto the busbar 2, the sensor chip 10 or the sensor element 12 can overlap at least partially with the busbar 2. An arrangement of the sensor element 12 in relation to the busbar 2 as shown by way of example in FIG. 8 can be used, for example, particularly in a GMR sensor element. In a further example, the sensor element 12 can be a Hall sensor element which can be arranged, in particular, closer to the edge of the busbar 2. The sensor element 12 and the busbar 2 can overlap only partially or even not at all. In the example shown in FIG. 8, the sensor chip 10 can be arranged on a surface of the connecting lead 4 facing away from the busbar 2. A distance $d_3$ between the sensor chip 10 and the busbar 2 can be located in a downwardly and upwardly limited area. A lower limit of this area can be around 5 micrometers or around 10 micrometers or around 15 micrometers or around 20 micrometers or around 30 micrometers or around 40 micrometers. An upper limit of the area can be located at around 2 millimeters or around 1.5 millimeters or around 1 millimeter or around 500 micrometers or around 200 micrometers or around 100 micrometers.

The sensor chip 10 can be arranged with only a subsection of its underside on the connecting lead 4, whereas a further section of the underside can project beyond the connecting lead 4. The sensor element 12 can be arranged, in particular, in this overhanging area of the sensor chip 10. The sensor chip 10 can be arranged on the connecting lead 4 in such a way that the sensor element 12, viewed in the y-direction, is arranged above the busbar 2. The connecting lead 4 can be curved or bent in such a way that the sensor element 12 can be arranged above the busbar 2 in the manner described. In the example shown in FIG. 8, the connecting lead 4 can have two sections which can be located on different levels in the y-direction. Alternatively or additionally, in a further example, the busbar 2 and the connecting lead 4 can be arranged as offset in relation to one another in the y-direction.

Using the described arrangement of the sensor chip 10 on the connecting lead 4, the sensor element 12 can be placed precisely and contactlessly in a magnetic field which is generated by a measuring current flowing through the current lead/busbar 2. Using the overhanging section of the sensor chip 10, a creepage path between the connecting lead 4 and conducting parts of the sensor chip 10 can further be increased. Furthermore, due to the spacing $d_3$ between the busbar 2 and the sensor chip 10 and an encapsulation material 18 arranged in the spacing, a reliable galvanic isolation between the busbar 2 and the sensor chip 10 can be provided. The encapsulation material 18 of the sensor device 800 can be formed, in particular, in one piece.

The sensor device 800 can, in particular, be a coreless sensor device, e.g. the sensor device 800 can have or use no magnetic field concentrator to concentrate the magnetic field induced by the electric measuring current.

FIGS. 9 to 13 show schematically cross-section side views of sensor devices 900 to 1300 according to the disclosure. The sensor devices 900 to 1300 can be at least partially similar to the sensor device 800 shown in FIG. 8, so that explanations relating to FIG. 8 can apply to each of FIGS. 9 to 13 also.

Figure 9:
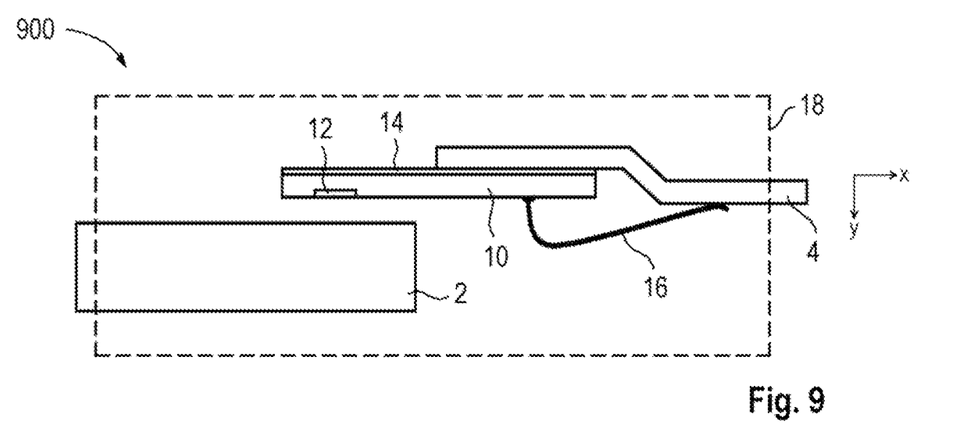
FIG. 9 shows schematically a cross-section side view of a sensor device 900 according to the disclosure.

In the example shown in FIG. 9, the sensor chip 10 can be arranged on a surface of the connecting lead 4 facing toward the busbar 2. Compared with FIG. 8, an even shorter distance between the busbar 2 and the sensor chip 10 or the sensor element 12 can be provided using an arrangement of this type. The shown arrangement of the sensor chip 10 between the thin connecting lead 4 and the thick busbar 2 can be regarded as unusual. In contrast, a relative arrangement of the sensor chip 10, the connecting lead 4 and the busbar 2 as shown in FIG. 8 can be regarded as a standard variant of the module. In the example shown in FIG. 9, the sensor element 12 can face toward the busbar 2. In further examples, the sensor element 12 can face toward the connecting lead 4.

Figure 10:
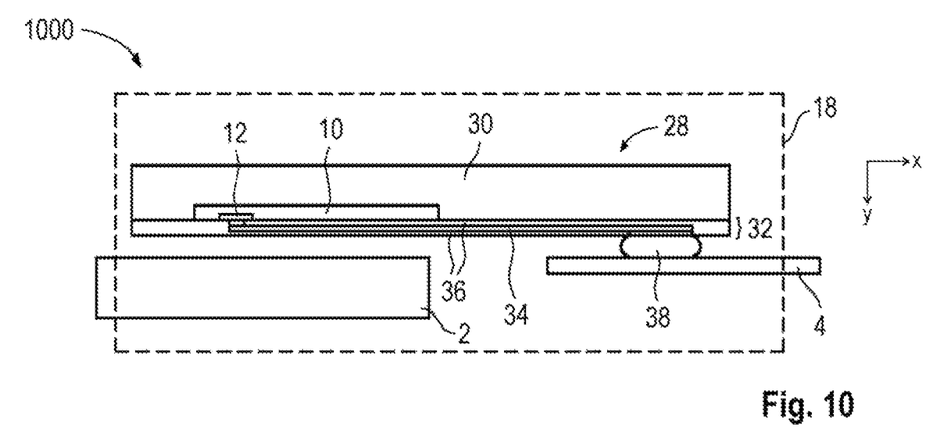
FIG. 10 shows schematically a cross-section side view of a sensor device 1000 according to the disclosure.

In the example shown in FIG. 10, a sensor package (sensor housing) 28 can be arranged on the connecting lead 4. The sensor package 28 can, for example, be a wafer-level package, e.g. an eWLB (embedded Wafer Level Ball Grid Array) package. The sensor package 28 can have a second encapsulation material 30 using which the sensor chip 10 can be encapsulated. The busbar 2 and/or the connecting lead 4 can be arranged, in particular completely, outside the second encapsulation material 30. The second encapsulation material 30 can comprise, for example, at least one of the following: a mold connection, a laminate, an epoxy, a filled epoxy, a glass-fiber-filled epoxy, an imide, a thermoplastic, a thermosetting polymer, a polymer blend. The materials of the encapsulation materials 18 and 30 can be the same or can differ from one another. In particular, the encapsulation materials 18 and 30 can be manufactured in different encapsulation processes or encapsulation processes performed at different times. The sensor package 28 or the sensor chip 10 can be electrically connected, for example via a solder connection 38, to the connecting lead 4.

The sensor package 28 can have a rewiring layer 32. The rewiring layer 32 can contain one or more conductor paths 34 in the form of metal layers or metal paths. A multiplicity of dielectric layers 36 can be arranged between the multiplicity of conductor paths 34 in order to electrically isolate the conductor paths 34 from one another. Metal layers/conductor paths 34 arranged on different levels can further be electrically interconnected using a multiplicity of through-connections (or vias). The conductor paths 34 of the rewiring layer 32 can provide the function of a rewiring or redistribution in order to electrically couple connections of the sensor chip 10 to external connections of the sensor package 28.

Figure 11:
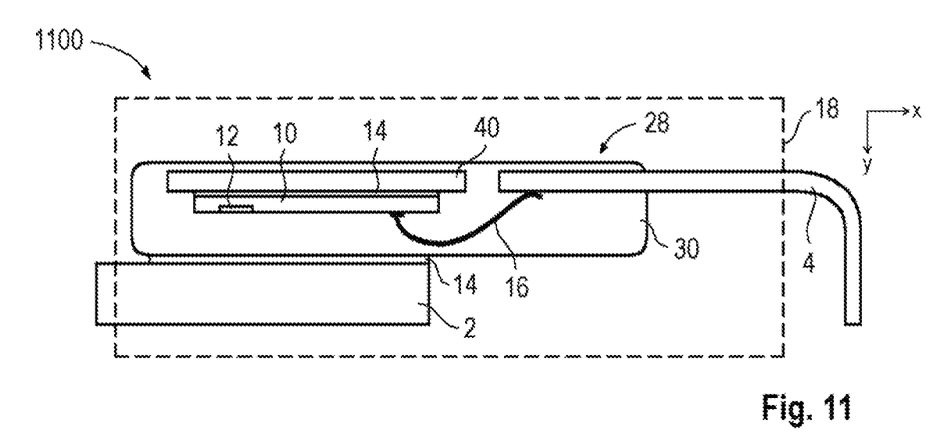
FIG. 11 shows schematically a cross-section side view of a sensor device 1100 according to the disclosure.

In the example shown in FIG. 11, a sensor package 28 can be attached to a busbar 2 using an attachment material 14. The sensor package 28 can, for example, be an SSO (Shrink Small Outline) package. The sensor package 28 can have a lead frame with a die pad 40 and a connecting lead 4. A sensor chip 10 can be attached to the die pad 40 using an attachment material 14. The sensor chip 10 can be electrically connected via an electrical connecting element 16 to the connecting lead 4. The die pad 40, the sensor chip 10 and the connecting lead 4 can be encapsulated by an encapsulation material 30 of the sensor package 28. The connecting lead 4 can protrude from the encapsulation material 30 in order to make the sensor chip 10 electrically contactable from outside the encapsulation material 30. In the example shown in FIG. 11, the connecting lead 4 can be bent downward, for example for an assembly of the sensor device 1100 on a board or printed circuit board (not shown). The busbar 2 can be arranged, in particular completely, outside the second encapsulation material 30 of the sensor package 28. The sensor package 28 and the busbar 2 can be encapsulated by a further encapsulation material 18 which can be formed, in particular, in one piece. The connecting lead 4 and the busbar 2 can protrude from the further encapsulation material 18 in order to be electrically contactable from outside the further encapsulation material 18.

Figure 12:
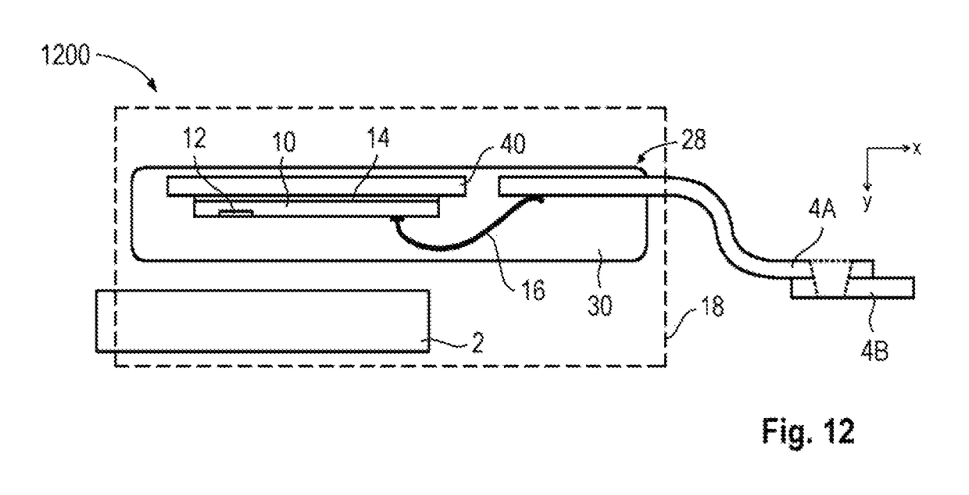
FIG. 12 shows schematically a cross-section side view of a sensor device 1200 according to the disclosure.

The sensor device 1200 shown in FIG. 12 can be at least partially similar to the sensor device 1100 shown in FIG. 11. In contrast to FIG. 11, the sensor package 28 can be spaced from the busbar 2. The encapsulation material 18 can be arranged in the area between the busbar 2 and the sensor package 28. In the example shown in FIG. 12, a connecting lead 4A protruding from the encapsulation material 18 can be designed as in the shape of a wing (gull wing). The connecting lead 4A can be welded to a further connecting lead 4B which can run essentially in the x-direction.

Figure 13:
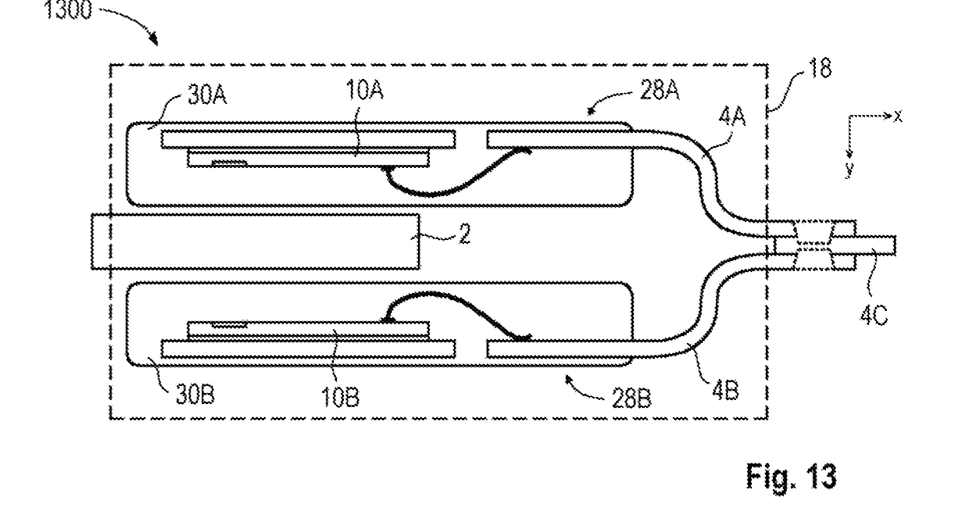
FIG. 13 shows schematically a cross-section side view of a sensor device 1300 according to the disclosure.

The sensor device 1300 shown in FIG. 13 can be at least partially similar to the sensor device 1200 shown in FIG. 12. In addition to a sensor package 28A arranged above the busbar 2, a further sensor package 28B can be arranged below the busbar 2. In FIG. 13, the sensor packages 28A, 28B can be designed, by way of example, with the same components back-to-front. In one example, the sensor chips 10A, 10B of the sensor packages 28A, 28B can be redundant sensor chips which can be based on the same sensor technology. In a further example, the sensor chips can be based on different sensor technologies and can thereby provide a sensor measurement diversity. The connecting leads 4A and 4B protruding from the respective encapsulation material 30A and 30B of the sensor package 28A and 28B and the further encapsulation material 18 can be welded to a further connecting lead 4C which can run essentially in the x-direction.

FIGS. 14 to 16 show schematically perspective views of sensor devices or sensor packages 1400 to 1600 according to the disclosure. The sensor devices 1400 to 1600 can be at least partially similar to each of the previously described sensor devices. Explanations relating to preceding figures can apply to each of FIGS. 14 to 16 also.

FIG. 14 shows a sensor package 1400 with an encapsulation material 18 which can form a housing body. Components such as those described in connection with preceding figures can be arranged in the encapsulation material 18. A busbar 2 and a plurality of connecting leads 4 can protrude from the encapsulation material 18. The busbar 2 can be designed, for example, as U-shaped and can run essentially evenly or in one plane. Two end pieces 44A, 44B of the busbar 2 can protrude from a lateral surface 42A of the encapsulation material 18 and can form an input and output connection for an electric current which is to be measured. The busbar 2 can further protrude at least partially from opposite-lying lateral surfaces 42B, 42D of the encapsulation material 18. The connecting lead 4 can protrude from a lateral surface 42C of the encapsulation material 18 and can be formed as essentially linear. Five connecting leads 4 are shown by way of example in FIG. 14. The number of connecting leads 4 can depend on the respective application and, in further examples, can differ in any way from the example shown in FIG. 14.

The sensor package 1500 shown in FIG. 15 can be similar to the sensor package 1400 shown in FIG. 14. In contrast to FIG. 14, the connecting leads 4 and the end pieces 44A, 44B of the busbar 2 can be bent downward in FIG. 15. The sensor package 1500 can, for example, be mechanically and electrically connected via the bent connecting leads 4 and bent end pieces 44A, 44B to a board (not shown) arranged under the sensor package 1500.

The sensor package 1600 shown in FIG. 16 can be similar to the sensor package 1500 shown in FIG. 15. In contrast to FIG. 15, one or both of the end pieces 44A, 44B of the busbar 2 can be designed as comb-shaped and can form a plurality of connections 46 due to the comb-shaped structure. Four connections 46 are shown by way of example in FIG. 16. The number of connections 46 can depend on the respective application and can differ in any way in further examples.

FIGS. 17A-C and 18A-B show schematically top views of busbars which can be contained in the previously described sensor devices according to the disclosure.

Figure 17A:
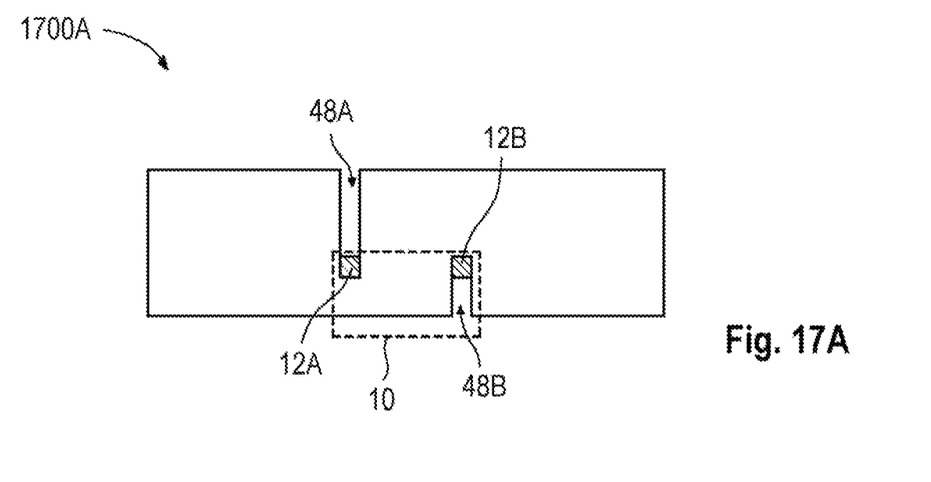
FIGS. 17A to 17C show schematically top views of busbars 1700A to 1700C which can be contained in a sensor device according to the implementation.

FIG. 17A shows a busbar 1700A and a sensor chip 10 arranged above it having two sensor elements 12A, 12B. The sensor chip 10 can, in particular, be a differential sensor chip and the sensor elements 12A, 12B can, in particular, be Hall sensor elements. The busbar 1700A in the example shown in FIG. 17A can have two indentations 48A, 48B so that the busbar in the top view shown in FIG. 17A can be designed as essentially S-shaped. In further examples, the busbar can have a different number of indentations. An electric measuring current flowing, for example, from left to right through the busbar 1700A shown in FIG. 17A can accordingly have an essentially S-shaped path and can flow around the left sensor element 12A in the counterclockwise direction and around the right sensor element 12B in the clockwise direction. Due to a measuring current path of this type, the measuring current can generate a differential magnetic field having opposite directions at the locations of the sensor elements 12A, 12B on the basis of which the measuring current can be measured or determined. In the top view shown in FIG. 17A, the busbar 1700A (or the current path of the measuring current) and the sensor elements 12A, 12B can in each case be (at least partially) overlap-free. It can be ensured as a result that the induced magnetic field has a component perpendicular to the respective Hall sensor element at the location of the sensor elements 12A, 12B. In one example, the busbar 17A and the sensor elements 12A, 12B can in each case be completely overlap-free. In a further example, the busbar 1700A and the sensor elements 12A, 12B can in each case overlap to a small extent. The busbar 1700A and the sensor elements 12A, 12B can be at least 80% or at least 85% or at least 90% or at least 95% overlap-free.

Figure 17B:
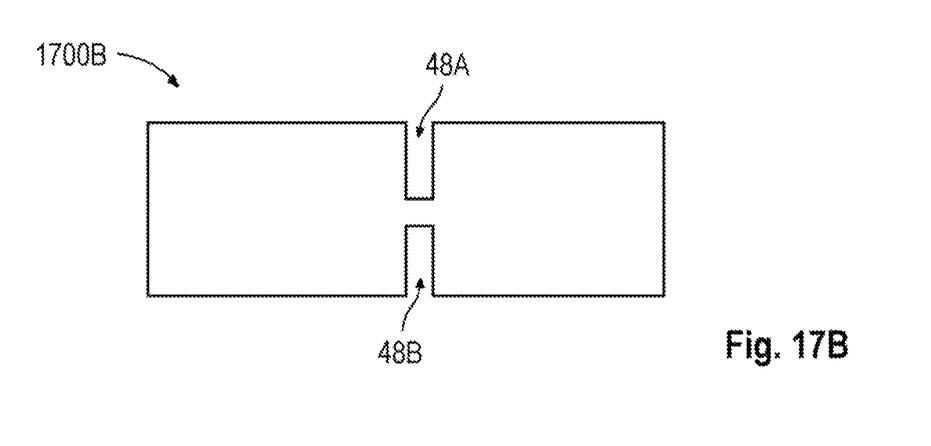

Similar to FIG. 17A, the busbar 1700B shown in FIG. 17B can be used in connection with Hall sensor elements. In contrast to FIG. 17A, the indentations 48A and 48B in the example shown in FIG. 17B do not have to be arranged as laterally offset in relation to one another, but can be aligned with one another. Sensor elements of a sensor chip and the busbar 1700B can be arranged (at least partially) overlap-free. In one example, the sensor chip can have two Hall sensor elements which can be arranged on the inner ends of the indentations 48A, 48B. A measuring current can pass through the busbar 1700B, for example from the bottom left between the sensor elements of the indentations 48A, 48B through to the top right.

Figure 17C:
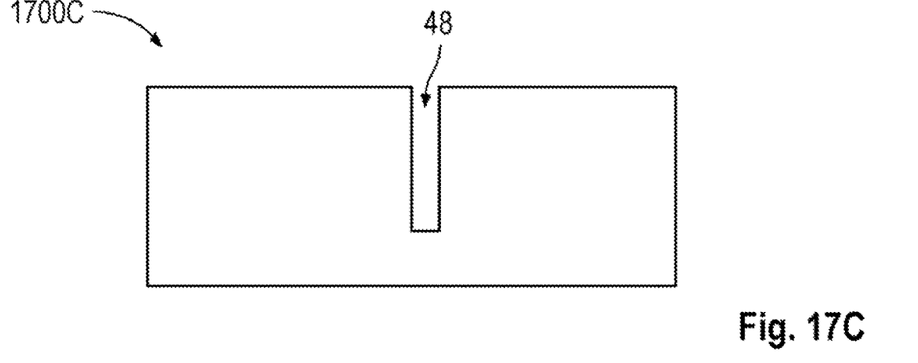

The busbar 1700C shown in FIG. 17C can have a single indentation 48 and can be used in connection with a Hall sensor element. The sensor element can be arranged, for example, at the inner end of the indentation 48. A measuring current can pass, for example, from the top left around the indentation 48 to the top right.

Figure 18A:
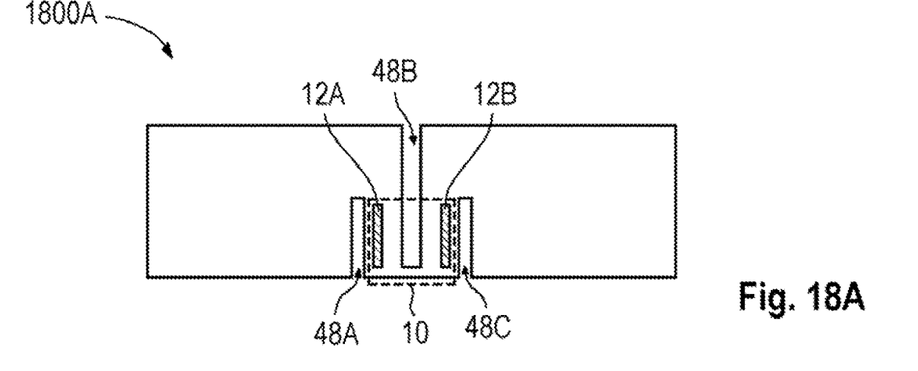
FIGS. 18A and 18B show schematically top views of busbars 1800A and 1800B which can be contained in a sensor device according to the implementation.

FIG. 18A shows a busbar 1800A and a sensor chip 10 arranged above it having two sensor elements 12A, 12B. The sensor chip 10 can, in particular, be a differential sensor chip and the sensor elements 12A, 12B can, in particular, be magnetoresistive sensor elements or vertical Hall sensor elements or fluxgate sensor elements. The sensor elements 12A, 12B can, for example, be magnetoresistive xMR sensor elements, in particular AMR sensor elements, GMR sensor elements or TMR sensor elements. The busbar 1800A in the example shown in FIG. 18A can have three indentations 48A to 48C so that the busbar 1800A and a measuring current path in the top view shown in FIG. 18A can be designed as essentially serpentine-shaped. In further examples, the busbar can have a different number of indentations. Since the aforementioned sensor element types shown in FIG. 18A can be sensitive, in particular to an "in-plane" magnetic field component, the sensor elements 12A, 12B can be aligned with the busbar 1800A or the measuring current path. In other words, the sensor elements 12A, 12B can be arranged directly above the path of the busbar 1800A or the measuring current. This means that, in the top view shown in FIG. 18A, the busbar 1800A and the sensor elements 12A, 12B can in each case (in particular completely) overlap one another.

Figure 18B:
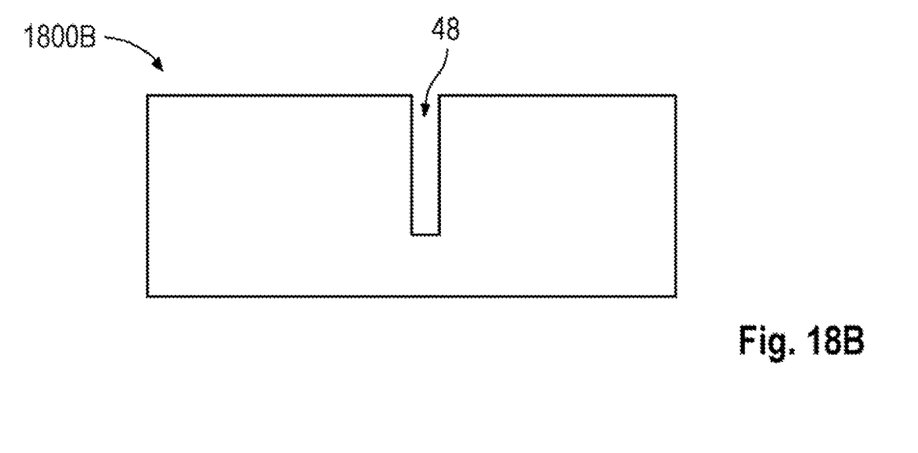

Similar to FIG. 18A, the busbar 1800B shown in FIG. 18B can be used in connection with an xMR sensor element. The sensor element can be arranged at the indentation 48, wherein the busbar 1800B and the sensor element can (in particular completely) overlap one another.

It should be noted that the examples described herein can be combined with one another in any way according to the disclosure. For example, a spacing between the dielectric 6 and the busbar 2 (cf. FIGS. 1 to 7) can be provided, for example, by using a second dielectric 8 (cf. FIG. 1) in combination with a depression 22 in the busbar 2 (cf. FIG. 5). In a further example, the busbar 2 can be curved (cf. FIG. 3) and can additionally have a depression 22 (cf. FIG. 5). For the sake of simplicity, not all possible combinations of the described aspects according to the disclosure are described in detail herein.

EXAMPLES

Sensor devices are explained below on the basis of examples.

Example 1 is a sensor device, comprising: a busbar; a dielectric arranged on the busbar; and a sensor chip arranged on the dielectric, wherein the sensor chip is designed to measure a magnetic field induced by an electric current flowing through the busbar, wherein the surface of the dielectric facing toward the busbar is spaced from the busbar in an area along the entire periphery of the dielectric.

Example 2 is a sensor device according to example 1, wherein the busbar comprises a first section and a second section, wherein the first section is connected to the dielectric and the second section is at a distance from the dielectric.

Example 3 is a sensor device according to example 1 or 2, wherein the busbar is formed in one piece.

Example 4 is a sensor device according to one of the preceding examples, wherein the spacing between the dielectric and the busbar is provided by a depression in the busbar.

Example 5 is a sensor device according to one of the preceding examples, wherein the spacing between the dielectric and the busbar is provided by a base arranged on the busbar, wherein the dielectric is mechanically connected to the base.

Example 6 is a sensor device according to one of the preceding examples, wherein the spacing between the dielectric and the busbar is provided by a curving of the busbar.

Example 7 is a sensor device according to one of the preceding examples, wherein the spacing between the dielectric and the busbar is provided by a further dielectric which is arranged between the busbar and the dielectric.

Example 8 is a sensor device according to one of the preceding examples, wherein the spacing between the dielectric and the busbar is provided by a shaping of the dielectric so that the dielectric has different thicknesses.

Example 9 is a sensor device according to one of the preceding examples, wherein a distance between the sensor chip and the busbar is in a range from 5 micrometers to 2 millimeters.

Example 10 is a sensor device according to one of the preceding examples, further comprising: an encapsulation material formed in one piece, wherein the busbar, the dielectric and the sensor chip are encapsulated by the encapsulation material.

Example 11 is a sensor device according to example 10, wherein the encapsulation material is arranged within the spacing between the dielectric and the busbar.

Example 12 is a sensor device according to one of the preceding examples, further comprising: a lead frame, comprising a first part and a second part, wherein a thickness of the first part is greater than a thickness of the second part, wherein the busbar is formed by the first part of the lead frame, and wherein the second part of the lead frame forms a connecting lead which is electrically connected to the sensor chip.

Example 13 is a sensor device according to one of the preceding examples, wherein the sensor device has no magnetic field concentrator.

Example 14 is a sensor device according to one of the preceding examples, wherein the dielectric comprises at least one of the following materials: ceramic, glass, silicone-based materials, polymer-based materials.

Example 15 is a sensor device, comprising: a lead frame, comprising a first part and a second part, wherein a thickness of the first part is greater than a thickness of the second part; a busbar formed by the first part of the lead frame; a connecting lead formed by the second part of the lead frame; and a sensor chip arranged on the connecting lead, wherein the sensor chip is designed to measure a magnetic field induced by an electric current flowing through the busbar, wherein, in an orthogonal projection of the sensor chip onto the busbar, the sensor chip overlaps at least partially with the busbar.

Example 16 is a sensor device according to example 15, further comprising: an encapsulation material formed in one piece, wherein the busbar, the connecting lead and the sensor chip are encapsulated by the encapsulation material, and the encapsulation material is arranged between the busbar and the sensor chip.

Example 17 is a sensor device according to example 15 or 16, further comprising: a further encapsulation material, wherein the sensor chip is encapsulated by the further encapsulation material and the busbar is arranged outside the further encapsulation material.

Example 18 is a sensor device according to one of examples 15 to 17, wherein the sensor chip is arranged on a surface of the connecting lead facing away from the busbar.

Example 19 is a sensor device according to one of examples 15 to 17, wherein the sensor chip is arranged on a surface of the connecting lead facing toward the busbar.

Example 20 is a sensor device according to one of examples 15 to 19, wherein a distance between the sensor chip and the busbar is in a range from 5 micrometers to 2 millimeters.

Although specific implementations have been presented and described herein, it is obvious to the average person skilled in the art that a multiplicity of alternative and/or equivalent implementations can replace the shown and described specific implementations without departing the scope of the present disclosure. This application is intended to cover all adaptations or variations of the specific implementations discussed herein. It is therefore intended that this disclosure is limited only by the claims and their equivalents.

What is claimed is:

1. A sensor device, comprising:
    a busbar;
    a dielectric arranged on the busbar, wherein the dielectric extends past a first end of the busbar and is shorter than a second end of the busbar opposite from the first end of the busbar; and
    a sensor chip arranged on the dielectric, wherein the sensor chip is configured to measure a magnetic field induced by an electric current flowing through the busbar;
    an encapsulation material,
        wherein the dielectric and the sensor chip are encapsulated by the encapsulation material, and
        wherein the busbar comprises a first section, associated with the first end of the busbar and encapsulated by the encapsulation material, and a second section associated with the second end of the busbar and protruding at least partially from the encapsulation material.

2. The sensor device as claimed in claim 1, wherein the first section of the busbar is connected to the dielectric and the second section of the busbar is at a distance from the dielectric.

3. The sensor device as claimed in claim 1, wherein a spacing between the dielectric and the busbar is provided by a base arranged on the busbar, wherein the dielectric is mechanically connected to the base.

4. The sensor device as claimed in claim 1, wherein a spacing between the dielectric and the busbar is provided by a depression in the busbar.

5. The sensor device as claimed in claim 1, wherein a spacing between the dielectric and the busbar is provided by a further dielectric which is arranged between the busbar and the dielectric.

6. The sensor device as claimed in claim 1, wherein a spacing between the dielectric and the busbar is provided by a shaping of the dielectric so that the dielectric has different thicknesses.

7. The sensor device as claimed in claim 1, wherein a distance between the sensor chip and the busbar is in a range from 5 micrometers to 2 millimeters.

8. The sensor device as claimed in claim 1, wherein the encapsulation material is formed into one piece.

9. The sensor device as claimed in claim 1, wherein the encapsulation material is arranged within a spacing between the dielectric and the busbar.

10. The sensor device as claimed in claim 1, further comprising:
    a lead frame comprising a first part of the lead frame and a second part of the lead frame,
        wherein a thickness of the first part of the lead frame is greater than a thickness of the second part of the lead frame,
        wherein the busbar is formed by the first part of the lead frame, and
        wherein the second part of the lead frame forms a connecting lead which is electrically connected to the sensor chip.

11. The sensor device as claimed in claim 1, wherein the sensor device has no magnetic field concentrator.

12. The sensor device as claimed in claim 1, wherein the dielectric comprises at least one of:
    ceramic,
    glass,
    silicone-based materials, or
    polymer-based materials.

13. The sensor device as claimed in claim 1, wherein the busbar is formed into one piece.

14. The sensor device as claimed in claim 13, wherein a spacing between the dielectric and the busbar is provided by a depression in the busbar.

15. A sensor device, comprising:
    a lead frame, comprising a first part of the lead frame and a second part of the lead frame, wherein a thickness of the first part of the lead frame is greater than a thickness of the second part of the lead frame;
    a busbar formed by the first part of the lead frame;
    a connecting lead formed by the second part of the lead frame; and
    a sensor chip arranged on a surface of the connecting lead facing towards the busbar, wherein the sensor chip is configured to measure a magnetic field induced by an electric current flowing through the busbar,
        wherein, in an orthogonal projection of the sensor chip onto the busbar, the sensor chip overlaps at least partially with the busbar.

16. The sensor device as claimed in claim 15, wherein a distance between the sensor chip and the busbar is in a range from 5 micrometers to 2 millimeters.

17. The sensor device as claimed in claim 15, wherein the busbar is formed into one piece.

18. The sensor device as claimed in claim 15, wherein the sensor device has no magnetic field concentrator.

19. The sensor device as claimed in claim 15, further comprising:
    an encapsulation material formed into one piece, wherein the busbar, the connecting lead and the sensor chip are encapsulated by the encapsulation material, and wherein the encapsulation material is arranged between the busbar and the sensor chip.

20. The sensor device as claimed in claim 19, further comprising:
a further encapsulation material, wherein the sensor chip is encapsulated by the further encapsulation material and the busbar is at least partially arranged outside the further encapsulation material.

* * * * *